US007679668B2

(12) United States Patent
Nagase et al.

(10) Patent No.: US 7,679,668 B2
(45) Date of Patent: Mar. 16, 2010

(54) SOLID STATE IMAGE PICKUP DEVICE AND ITS MANUFACTURE

(75) Inventors: Masanori Nagase, Miyagi (JP); Kaichiro Chiba, Kumamoto (JP)

(73) Assignee: Fujifilm Corporation, Minato-ku, Tokyo (JP)

( * ) Notice: Subject to any disclaimer, the term of this patent is extended or adjusted under 35 U.S.C. 154(b) by 566 days.

(21) Appl. No.: 11/520,815

(22) Filed: Sep. 14, 2006

(65) Prior Publication Data

US 2007/0064139 A1   Mar. 22, 2007

(51) Int. Cl.
*H04N 5/335* (2006.01)

(52) U.S. Cl. .................. 348/311; 257/232; 257/640; 257/649

(58) Field of Classification Search ........... 348/311, 348/315, 275; 438/75, 144, 155; 257/232, 257/249, 250, 639, 640, 649
See application file for complete search history.

(56) References Cited

U.S. PATENT DOCUMENTS

| 4,087,832 | A | * | 5/1978 | Jambotkar | 257/225 |
| 4,543,601 | A | | 9/1985 | Harada et al. | |
| 5,275,695 | A | * | 1/1994 | Chang et al. | 216/27 |
| 5,424,775 | A | * | 6/1995 | Kamisaka et al. | 348/311 |
| 5,492,852 | A | * | 2/1996 | Minami | 438/60 |
| 6,013,925 | A | * | 1/2000 | Ogawa | 257/232 |
| 6,066,511 | A | * | 5/2000 | Fukusyo | 438/60 |
| 6,084,273 | A | * | 7/2000 | Hirota | 257/368 |
| 6,468,826 | B1 | * | 10/2002 | Murakami et al. | 438/48 |
| 7,440,019 | B2 | * | 10/2008 | Suzuki et al. | 348/315 |
| 2004/0026718 | A1 | * | 2/2004 | Okamoto et al. | 257/215 |

FOREIGN PATENT DOCUMENTS

| EP | 0 492 144 A2 | 7/1992 |
| GB | 1 495 377 | 12/1977 |
| JP | 2003-332556 | 11/2003 |

OTHER PUBLICATIONS

Chinese Office Action dated Jun. 13, 2008 with an English-language translation.

* cited by examiner

*Primary Examiner*—Lin Ye
*Assistant Examiner*—Chriss S Yoder, III
(74) *Attorney, Agent, or Firm*—McGinn IP Law Group, PLLC

(57) ABSTRACT

A first silicon oxide film is formed on the surface of the semiconductor substrate in an area of a vertical transfer channel and a read gate contiguous with each other, and a silicon nitride film is formed on the first silicon oxide film. The silicon nitride film is isotropically etched by using a resist pattern formed on the silicon nitride film as a mask. A second silicon oxide film is formed on the surface of the etched silicon nitride film to form an insulating film containing silicon oxide films and a silicon nitride film. A photoelectric conversion element contiguous with the read gate on the opposite side of the vertical transfer channel is formed. The isotropical etching makes the silicon nitride film cover the vertical transfer channel, extend over the read gate, and have a tapered sidewall. A high quality solid state image pickup device can be manufactured.

13 Claims, 7 Drawing Sheets

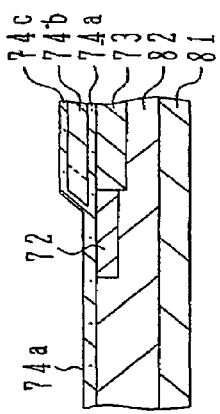
FIG.3A
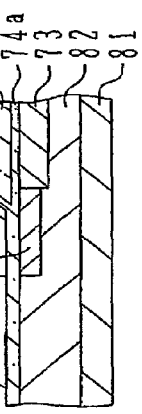
FIG.3B
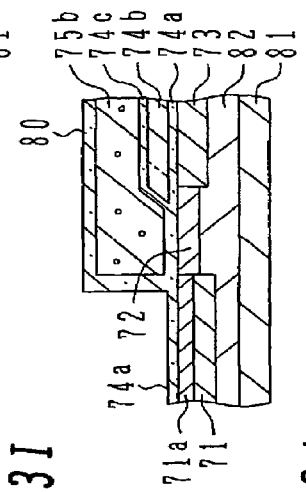
FIG.3C
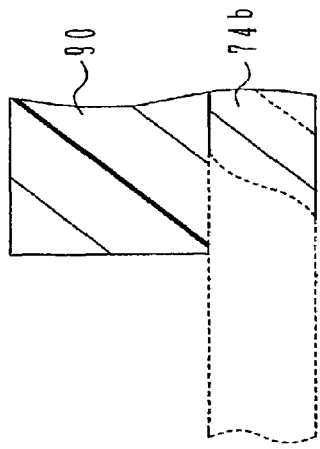
FIG.3D
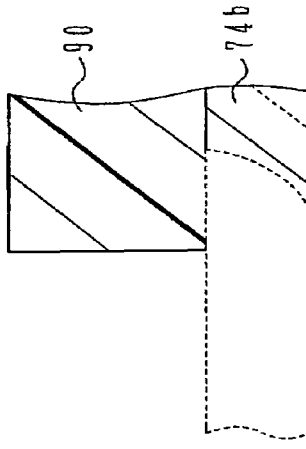
FIG.3E
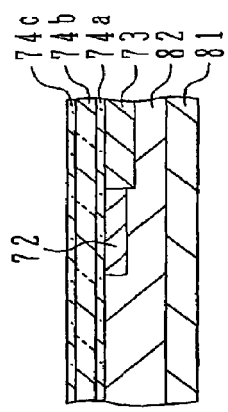
FIG.3F
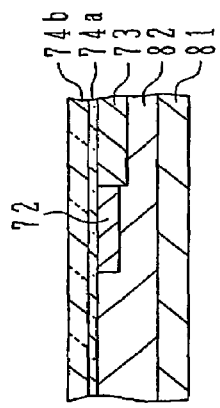
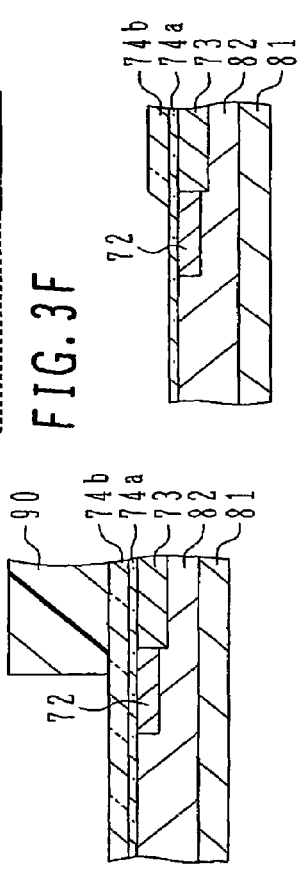
FIG.3G
FIG.3H
FIG.3I
FIG.3J

SOLID STATE IMAGE PICKUP DEVICE AND ITS MANUFACTURE

FIELD OF THE ART

The present invention relates to a solid state image pickup device and its manufacture method, and more particularly to a solid state image pickup device having the structure that a gate insulating film has therein a nitride film and its manufacture method.

BACKGROUND

FIG. 4A is a block diagram showing a main portion of a solid state image pickup apparatus assembling a solid state imaging pickup device, and FIGS. 4B and 4C are schematic plan views showing the structure of the solid state image pickup device. FIG. 4D is a schematic cross sectional view showing a portion of a pixel area of a solid state pickup device.

Referring to FIG. 4A, the structure of a solid state image pickup apparatus will be described. A solid state imaging pickup device 51 generates signal charge corresponding to an amount of light incident upon each pixel and supplies an image signal corresponding to the generated signal charge. A drive signal generator 52 generates drive signals (transfer voltage, etc.) for driving the solid state image pickup device 51 and supplies them to the solid state image pickup device 51. An analog front end (AFE) 53 subjects an output signal from the solid state imaging unit 51 to correlation double sampling, amplifies the sampled signal at an externally set gain, converts it into a digital signal, and outputs the digital signal. A digital signal processor (DSP) 54 processes an image signal supplied from the analog front end 53, such as recognition process, data compression and network control, and outputs the processed image data. A timing generator (TG) 55 generates timing signals for the solid state image pickup device 51, drive signal generator 52 and analog front end 53, to control the operations thereof.

The drive signal generator 52 includes, for example, a V driver for generating a vertical charge coupled device (CCD) drive signal. Signals supplied from the drive signal generator 52 to the solid state image pickup device 51 are a horizontal CCD drive signal, a vertical CCD drive signal, an output amplifier drive signal and a substrate bias signal.

As shown in FIG. 4B, the solid state image pickup device is constituted of: a plurality of photosensors 62 disposed, for example, in a matrix shape; a plurality of vertical CCDs 64 disposed near each column of the photosensors 62; a horizontal CCD 66 electrically connected to the vertical CCDs; and an amplifier circuit 67, connected to an output terminal of the horizontal CCD 66, for amplifying an output charge signal from the horizontal CCD 66. A pixel area 61 is constituted of the photosensors 62 and vertical CCDs 64.

The photosensor 62 is constituted of a photosensitive element, e.g., a photoelectric conversion element (photodiode) and a read gate. The photoelectric conversion element generates signal charge corresponding to an incidence light amount and accumulates them. Reading the accumulated signal charge to the vertical CCD 64 is controlled by a voltage applied to the read gate. The signal charge read to the vertical CCD 64 is transferred in the vertical CCDs (vertical transfer channel) 64 toward the horizontal CCD 66 (in a vertical direction). Signal charge transferred to the bottom end of the vertical CCDs 64 is transferred in the horizontal CCD (horizontal transfer channel) 66 in a horizontal direction, amplified by the amplifier circuit 67 and output to an external.

The photosensors 62 are disposed in a tetragonal matrix layout at a constant pitch in the row and column directions as shown in FIG. 4B, or disposed in a honeycomb layout in the row and column directions by shifting every second photosensors, for example, by a half pitch.

FIG. 4C is a schematic plan view of a solid state image pickup device having the honeycomb layout. The honeycomb layout has photosensors 62 disposed in a first tetragonal matrix layout and photosensors 62 disposed in a second tetragonal matrix layout at positions between lattice points of the first tetragonal matrix layout. Vertical CCDs (vertical transfer channels) 64 are disposed in a zigzag way between photosensors 62. Although this layout is called a honeycomb layout, the photosensor 62 of most honeycomb layouts is octangular.

As shown in FIG. 4D, formed in a p-type well 82 formed in a semiconductor substrate 81, e.g., an n-type silicon substrate, are a photoelectric conversion element 71 made of an n-type impurity doped region, a p-type read gate 72 disposed next to the photoelectric conversion element, and a vertical transfer channel 73 made of an n-type region disposed next to the read gate. A $p^+$-type burying or covering region 71a is formed on the photoelectric conversion element 71. A vertical transfer electrode 75 is formed above the vertical transfer channel 73, with a gate insulating film 74 being interposed therebetween. A p-type channel stop region 76 is formed between adjacent photoelectric conversion elements 71.

The channel stop region 76 is used for electrically isolating the photoelectric conversion elements 71, vertical transfer channels 73 and the like. The gate insulating film 74 is a silicon oxide film formed on the surface of the semiconductor substrate 81, for example, by thermal oxidation. The vertical transfer electrode 75 is constituted of first and second vertical transfer electrodes made of, for example, polysilicon. The first and second vertical transfer electrodes may be made of amorphous silicon. The potential of the vertical transfer channel 73 is controlled by a voltage (drive signal) applied to the vertical transfer electrode 75 so that signal charge is transferred in the vertical transfer channel 73. The potential of the read gate 72 is controlled by a voltage (drive signal) applied to the vertical transfer electrode 75 above the read gate 72 so that signal charge generated and accumulated in the photoelectric conversion element 71 is read to the vertical transfer channel 73. An insulating silicon oxide film 77 is formed on the vertical transfer electrode 75, for example, by thermally oxidizing polysilicon. The vertical CCD 64 is constituted of the vertical transfer channel 73, upper gate insulating film 74 and vertical transfer electrode 75.

A light shielding film 79 of, e.g., tungsten, is formed above the vertical transfer electrode 75, with the insulating silicon oxide film 77 being interposed therebetween. Openings 79a are formed through the light shielding film 79 at positions above the photoelectric conversion elements 71. A silicon nitride film 78 is formed on the light shielding film 79.

As described above, the light shielding film 79 has the openings 79a above the photoelectric conversion elements 71 and prevents light incident upon the pixel area 61 from entering the region other than the photoelectric conversion elements 71.

A planarized layer 83a made of, e.g., borophosphosilicate glass (BPSG) is formed above the light shielding film 79. On this planarized surface, a color filter layer 84 is formed which is of three primary colors: red (R), green (G) and blue (B). Another planarized layer 83b is formed on the color filter layer 84. On the planarized layer 83b having a planarized surface, micro lenses 85 are formed, for example, by melting and solidifying a photoresist pattern of micro lenses. Each micro lens 85 is a fine hemispherical convex lens disposed above each photoelectric conversion element 71. The micro lens 85 converges incidence light to the photoelectric conversion elements 71. Light converged by one micro lens 85 passes through the color filter layer 84 of one of the red (R), green (G) and blue (B) and becomes incident upon one photoelectric conversion element 71. Therefore, the photoelectric conversion elements include three types of photoelectric conversion elements: photoelectric conversion elements upon which light passed through the red (R) color filter layer 84 becomes incident; photoelectric conversion elements upon which light passed through the green (G) color filter layer 84 becomes incident; and photoelectric conversion elements upon which light passed through the blue (B) color filter layer 84 becomes incident.

FIGS. 5A and 5B are schematic diagrams illustrating a manufacture method for a solid state image pickup device.

Referring to FIG. 5A, a semiconductor substrate 81, e.g., an n-type silicon substrate, is prepared and p-type impurities, e.g., boron ions, are implanted to form a p-type well 82.

In a surface layer of the well 82, n-type impurities, e.g., phosphorus or arsenic ions, are implanted to form a vertical transfer channel 73. A read gate 72 and a channel stop region 76 are formed by implanting p-type impurities, e.g., boron ions. An insulating film 74 is formed on the semiconductor substrate 81, the insulating film being an oxide-nitride-oxide (ONO) film including a thermally oxidized silicon oxide film, a silicon nitride film formed through chemical vapor deposition (CVD) and a silicon oxide film formed by thermally oxidizing the surface of the silicon nitride film.

A vertical transfer electrode 75 made of, for example, polysilicon, is formed covering the vertical transfer channel 73. The vertical transfer electrode 75 is made of, for example, first and second transfer electrodes stacked in the vertical direction. The vertical transfer electrode 75 is formed by depositing polysilicon on the insulating film 74, for example, by CVD and patterning it through photolithography and etching.

By using the vertical transfer electrode 75 as a mask or by using a resist pattern formed by coating resist on the surfaces of the vertical transfer electrode 75 and insulating film 74 and exposing and developing the resist, n-type impurities, e.g., phosphorus or arsenic ions are implanted to form a photoelectric conversion element 71. A burying layer 71a is formed by implanting p-type impurities, e.g., boron ions. The vertical transfer electrode 75 is thermally oxidized to form a silicon oxide film 77 on the surface thereof.

A horizontal CCD 66 is also formed in the semiconductor substrate 81 by using the above-described processes. An amplifier circuit 67 and the like are also formed.

Referring to FIG. 5B, a light shielding film 79 of, for example, tungsten, is formed above the silicon oxide film 77. Resist is coated on the light shielding film 79, exposed and developed to leave the resist in predetermined areas. By using this resist as a mask, the light shielding film 79 is etched to form an opening 79a above the photoelectric conversion element 71.

A silicon nitride film 78 is formed covering the light shielding film 79, and then a planarized layer 83a of BPSG is formed, for example, by CVD. For example, a deposited BPSG film is reflowed at 850° C. to form the planarized layer 83a. In addition to reflow, planarization may be performed, for example, by chemical mechanical polishing (CMP). Instead of BPSG, silicon oxide doped with impurities to lower a melting point may also be used.

On the planarized surface of the planarized layer 83a, a color filter layer 84 of three primary colors of red (R), green (G) and blue (B) is formed. For example, the color film layer 84 is formed by coating photoresist liquid mixed with granular pigment (pigment dispersed resist liquid) on the surface of the planarized layer 83a, exposing and developing it and curing it at a curing temperature of 220° C. Filter layers of three colors of red (R), green (G) and blue (B) are sequentially formed.

A planarized layer 83b is formed on the color filter layer 84 because the surface of the color filter layer 84 is irregular. For example, the planarized layer 83b is formed by coating material having the similar composition as that of transparent resin and curing it at a curing temperature of 220° C. Next, micro lenses 85 are formed on the planarized layer 83b.

FIGS. 6A and 6B are schematic cross sectional views showing the insulating film 74 near the read gate 72.

Referring to FIG. 6A, the insulating film 74 often adopts the ONO structure having the silicon nitride film 74b as an oxygen intercepting film sandwiched between the silicon oxide films 74a and 74c, as described earlier. Electrons constituting signal charge are accelerated by an electric field generated by a read voltage and partially become hot electrons, which may be trapped at the interface between the silicon nitride film 74b and silicon oxide film 74a, which may induce a temporal change in the read voltage.

The invention aiming to provide a solid state image pickup device is disclosed which device is stable, highly reliable, thin, and high in breakdown voltage and can suppress a temporal change in the read voltage caused by hot electrons (e.g., refer to Japanese Patent Laid-open Publication No. 2003-332556).

FIG. 6B is a schematic cross sectional view showing a characteristic portion of a solid state image pickup device according to the invention described in Japanese Patent Laid-open Publication No. 2003-332556. As shown, the solid state image pickup device of this invention includes a photoelectric conversion element 71 formed in a semiconductor substrate 81 and an insulating film 74 above a vertical transfer channel 73 near the photoelectric conversion element. The insulating film 74 has a lamination structure of silicon oxide films 74a and 74c and a silicon nitride film 74b. At least the silicon nitride film 74b of the insulating film 74 does not extend near to the upper end portion of the photoelectric conversion element 71.

FIGS. 7A to 7E are schematic cross sectional views illustrating a manufacture method for the characteristic portion of the solid state image pickup device according to the invention described in Japanese Patent Laid-open Publication No. 2003-332556.

Referring to FIG. 7A, on the surface of a p-type well 82 formed in a semiconductor substrate 81 of an n-type silicon substrate, an insulating film is formed having a three-layer structure of a silicon oxide film 74a having a thickness of 15 nm, a silicon nitride film 74b having a thickness of 50 nm and a silicon oxide film 74c having a thickness of 10 nm sequentially formed in this order from the bottom. Next, a heavily doped polysilicon film having a thickness of 0.4 μm is formed in order to form a vertical transfer electrode 30.

As shown in FIG. 7B, by using a resist pattern formed through photolithography as a mask, the polysilicon film is patterned by reactive ion etching (RIE) to form the electrode 30. By using the electrode 30 as a mask, the silicon oxide film 74c is etched.

As shown in FIG. 7C, a thermally oxidized film 31 is formed on the surface of the electrode 30 through thermal oxidation. The thermally oxidized film 31 is hardly formed on the silicon nitride film 74b. The thermally oxidized film 31 on the silicon nitride film 74b, if any, can be removed easily by an acid process.

As shown in FIG. 7D, after the thermally oxidized film 31 on the silicon nitride film 74b is removed by an acid process, the silicon nitride film 74b is selectively wet-etched with hot phosphoric acid, being laterally etched by a width of about 0.2 µm under the end portion of the electrode 30.

As shown in FIG. 7E, thermal oxidation is performed to bury the region under the end portion of the electrode without the silicon nitride film 74b.

In the solid state image pickup device formed in this manner, the insulating film under the electrode 30 near the photoelectric conversion element 71 has at its end portion a single layer structure of the silicon oxide film not containing the silicon nitride film 74b. It is therefore possible to maintain good read characteristics without a temporal change in the read voltage.

This single layer structure can be formed through isotropical etching without the necessity of a new photolithography process. A solid state image pickup device having good characteristics can be manufactured very easily with good workability.

SUMMARY OF THE INVENTION

An object of this invention is to provide a high quality solid state image pickup device and its manufacture method.

According to one aspect of the present invention, there is provided a solid state image pickup device comprising: a plurality of photoelectric conversion elements, disposed in a semiconductor substrate in a matrix shape, for photoelectrically converting incidence light into signal charge; a plurality of vertical transfer channels each disposed in the semiconductor substrate adjacent to each column of the photoelectric conversion elements; a read gate, formed between the photoelectric conversion element and the vertical transfer channel, for controlling to read signal charge generated in the photoelectric conversion element to the vertical transfer channel; an insulating film including a silicon oxide film formed on the semiconductor substrate and covering the photoelectric conversion elements, the read gates and the vertical transfer channels, and a silicon nitride film covering the vertical transfer channels via the silicon oxide film, extending above surfaces of the read gates, and having a tapered side wall; a vertical transfer electrode having a plurality of layers alternately formed along a column direction and formed above the insulating film, the vertical transfer electrode reading signal charge generated in each of the photoelectric conversion elements to a corresponding one of the vertical transfer channels by controlling a potential of the read gate, and transferring the signal charge read to the vertical transfer channel along the column direction by controlling a potential of the vertical transfer channel; and a horizontal CCD for transferring signal charge transferred from the vertical transfer channels along a row direction.

A high quality solid state image pickup device can be provided which can suppress a temporal change in a charge read voltage, an insufficient breakdown voltage between a first layer vertical transfer electrode and a second layer vertical transfer electrode, and degradation of a transfer efficiency.

According to another aspect of the present invention, there is provided a manufacture method for a solid state image pickup device, comprising steps of: (a) forming a vertical transfer channel and a read gate contiguous with each other by doping impurities into a semiconductor substrate; (b) forming a first silicon oxide film on a surface of the semiconductor substrate in an area of the vertical transfer channel and the read gate, and forming a silicon nitride film on the first silicon oxide film; (c) forming a resist pattern on the silicon nitride film, isotropically etching the silicon nitride film by using the resist pattern as a mask, and thereafter removing the resist pattern; (d) forming a second silicon oxide film on a surface of the etched silicon nitride film to form an insulating film containing silicon oxide films and a silicon nitride film; (e) forming a vertical transfer electrode above the vertical transfer channel; and (f) doping impurities into the semiconductor substrate to form a photoelectric conversion element contiguous with the read gate on an opposite side of the vertical transfer channel, wherein the step (c) performs isotropical etching to make the silicon nitride film cover the vertical transfer channel and extend over the read gate.

The solid state image pickup device manufacture method can manufacture a high quality solid state image pickup device capable of suppressing a temporal change in a charge read voltage, an insufficient breakdown voltage between a first layer vertical transfer electrode and a second layer vertical transfer electrode, and degradation of a transfer efficiency.

According to the present invention, it is possible to provide a high quality solid state image pickup device and its manufacture method.

BRIEF DESCRIPTION OF THE DRAWINGS

FIGS. 3A to 3J are schematic cross sectional views illustrating a manufacture method for the characteristic portion of a solid state image pickup device according to an embodiment.

DESCRIPTION OF THE PREFERRED EMBODIMENTS

Figure 5A:
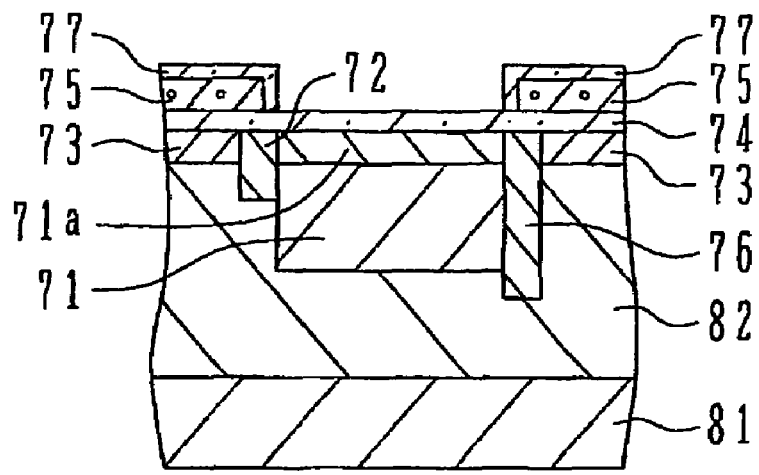
FIGS. 5A and 5B are schematic cross sectional views illustrating a manufacture method for a solid state image pickup device.

The present inventors manufactured the characteristic portion of a solid state image pickup device by the following manufacture method. The manufacture method for the other portion of the solid state image pickup device is similar to that described with reference to FIGS. 5A and 5B.

FIGS. 1A to 1E are schematic cross sectional views illustrating a manufacture method for a characteristic portion of a solid state image pickup device according to the invention.

Figure 1A:
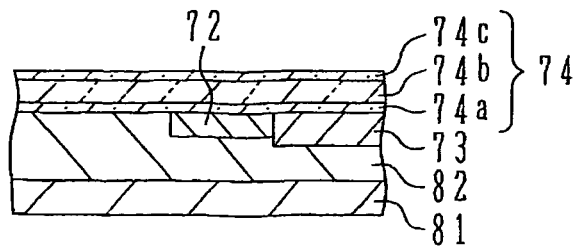
FIGS. 1A to 1E are schematic cross sectional views illustrating a manufacture method for a characteristic portion of a solid state image pickup device according the preliminary study.

Referring to FIG. 1A, in a semiconductor substrate 81, e.g., an n-type silicon substrate, p-type impurities, e.g., boron ions, are implanted to form a p-type well 82. In a surface layer of the well 82, n-type impurities, e.g., phosphorus or arsenic ions, are implanted to form a vertical transfer channel 73. A read gate 72 and the like are formed by implanting p-type impurities, e.g., boron ions. An insulating film 74 is formed on the surface of the p-type well 82, the insulating film including a thermally oxidized silicon oxide film (bottom oxide film) 74a having a thickness of 25 nm, a silicon nitride film 74b having a thickness of 50 nm and formed through CVD and a silicon oxide film (top oxide film) 74c having a thickness of 5 nm and formed by thermally oxidizing the surface of the silicon nitride film, respectively formed in this order from the bottom.

Figure 1B:
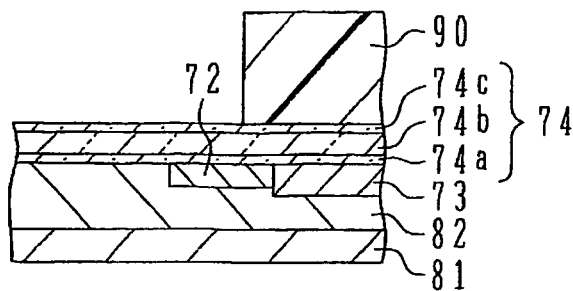

As shown in FIG. 1B, a resist pattern 90 having a predetermined pattern is formed on the silicon oxide film (top oxide film) 74c by photolithography.

Figure 1C:
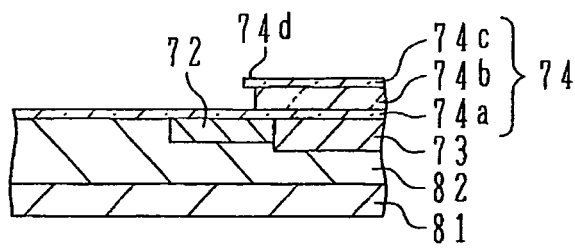

As shown in FIG. 1C, by using the resist pattern 90 as a mask, the silicon oxide film (top oxide film) 74c and the silicon nitride film 74b are removed by isotropical etching (isotropical chemical dry etching, wet etching or the like). For example, the silicon oxide film (top oxide film) 74c is etched with hydrofluoric acid, and the silicon nitride film 74b is etched with hot phosphoric acid. With isotropical etching, an etch selection ratio of the silicon nitride film 74b to the silicon oxide film (bottom oxide film) 74a can be set high.

With the resist pattern 90 being removed, the silicon nitride film 74b and silicon oxide film (top oxide film) 74c are partially left. The silicon nitride film 74b has vertical side walls, and the silicon oxide film (top oxide film) 74c has an overhang 74d protruding from the edge of the silicon nitride film 74b.

Figure 1D:
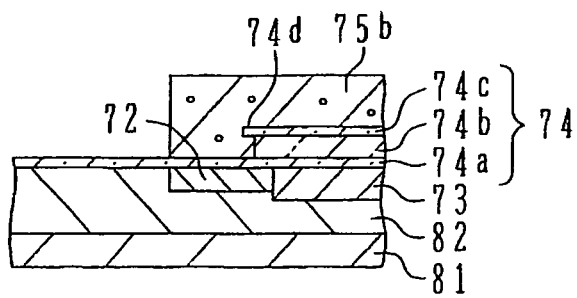

As shown in FIG. 1D, a polysilicon film heavily doped with phosphorus is deposited on the gate insulating film 74 to a thickness of 0.3 μm. By using a resist pattern formed by photolithography as a mask, the polysilicon film is patterned by reactive ion etching to form a first layer vertical transfer electrode 75b.

Figure 1E:
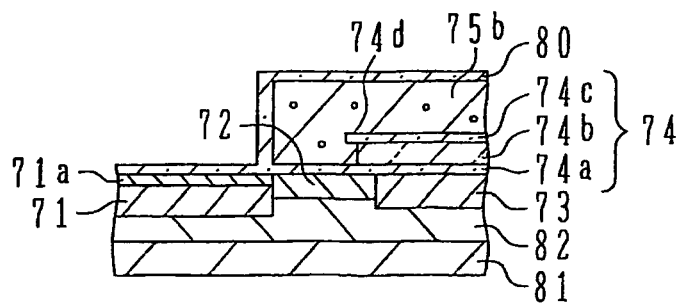

As shown in FIG. 1E, the surface of the first layer vertical transfer electrode 75b is thermally oxidized to form an interlayer insulating film 80 in order to ensure electric insulation from a second layer vertical transfer electrode. Thereafter, another polysilicon film is deposited and patterned to form the second layer vertical transfer electrode. By using the first layer vertical transfer electrode and second layer vertical transfer electrode as a mask, n-type impurities, e.g., phosphorus or arsenic ions and p-type impurities, e.g., boron ions, are implanted to form impurity doped regions such as a photoelectric conversion element 71 and a burying region 71a.

FIGS. 2A to 2E are diagrams explaining problems, newly found by the present inventors, of a solid state image pickup device manufactured by the method illustrated in FIGS. 1A to 1E.

Figure 2A:
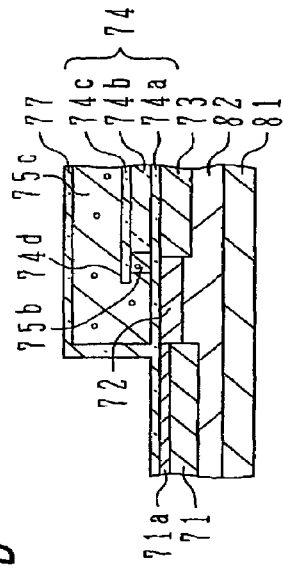
FIGS. 2A to 2E are diagrams explaining problems, newly found by the present inventors, of a solid state image pickup device manufactured by the method illustrated in FIGS. 1A to 1E.

FIG. 2A is a schematic plan view showing the photoelectric conversion element 71, vertical transfer electrode 75 (first layer vertical transfer electrode 75b, second layer vertical transfer electrode 75c) and vertical transfer channel 73. An area near the read gate 72 is indicated surrounded by a two-dot chain line.

Figure 2B:
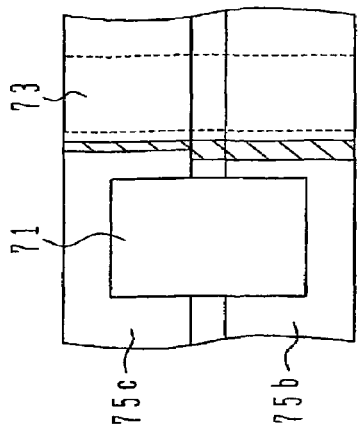

FIG. 2B is a cross sectional view taken along line 2B-2B shown in FIG. 2A.

The first layer vertical transfer electrode 75b having the interlayer insulating film 80 formed on the surface thereof through thermal oxidation is formed on the silicon oxide film (bottom oxide film) 74a and on the silicon oxide film (top oxide film) 74c having the overhang 74d. Since the silicon nitride film 74b is etched vertically as described earlier, the first layer vertical transfer electrode 75b is formed surrounding the overhang 74d of the silicon oxide film (top oxide film) 74c in a key shape.

Figure 2C:
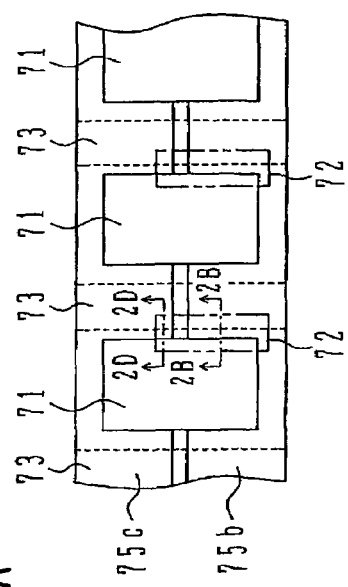

FIG. 2C is a schematic cross sectional view showing a region near the read gate 72 where the first layer vertical transfer electrode 75b is not formed, in the state after the first layer vertical electrode 75b is formed by pattering the polysilicon film by reactive ion etching. The polysilicon film of the first layer vertical transfer electrode 75b craws under the overhang 74d of the silicon oxide film (top oxide film) 74c. Oxidizing the polysilicon film under the overhang 74d of the silicon oxide film (top oxide film) 74c is restricted in some cases during thermal oxidation after the polysilicon layer is patterned.

The second layer vertical transfer electrode 75c is formed on the silicon oxide film (bottom oxide film) 74a and on the silicon oxide film (top oxide film) 74c, in the state shown in FIG. 2C.

Figure 2D:
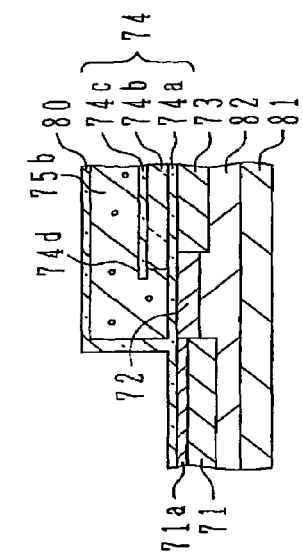

FIG. 2D is a cross sectional view taken along line 2D-2D shown in FIG. 2A and showing the second layer vertical transfer electrode 75c and a silicon oxide film 77 formed on the structure shown in FIG. 2C.

The second layer vertical transfer electrode 75c also serving as the gate read electrode is also formed on the silicon oxide film (bottom oxide film) 74a and on the silicon oxide film (top oxide film) 74c having the overhang 74d. However, there is the case in which the polysilicon of the first layer vertical transfer electrode 75b is left under the overhang 74d of the silicon oxide film (top oxide film) 74a. There occurs therefore the case in which a breakdown voltage between the first layer vertical transfer electrode 75b and the second layer vertical transfer electrode 75c becomes insufficient and the transfer efficiency of charge in the vertical transfer channel 73 is degraded. These problems are serious even for the solid state image pickup device having the structure capable of suppressing the temporal change in the charge read voltage.

Figure 2E:
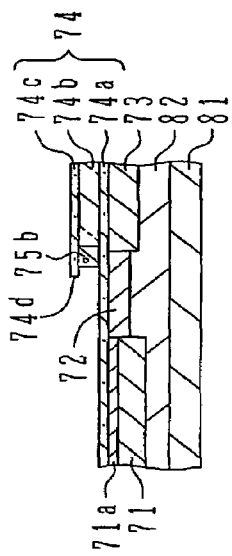

FIG. 2E is a partially enlarged view of FIG. 2A. In order to make it easy to understand, an area having polysilicon of the first layer vertical transfer electrode 75c left under the overhang 74d of the silicon oxide film (top oxide film) 74c, is indicated by hatched lines.

The inventions made by the present inventors solve the above-described new problems and provide a high quality solid image pickup device having the following structure and its manufacture method.

FIGS. 3A to 3J are schematic cross sectional views illustrating a manufacture method for a characteristic portion of a solid state image pickup device according to an embodiment. The manufacture method for the other portion of the solid state image pickup device is similar to that described with reference to FIGS. 5A and 5B.

Referring to FIG. 3A, in a semiconductor substrate 81, e.g., an n-type silicon substrate, p-type impurities, e.g., boron ions, are implanted to form a p-type well 82. In a surface layer of the well 82, n-type impurities, e.g., phosphorus or arsenic ions, are implanted to form a vertical transfer channel 73. A read gate 72 contiguous with the vertical transfer channel 73 and the like are formed by implanting p-type impurities, e.g., boron ions. An insulating film is formed covering these regions on the surface of the semiconductor substrate 81 (the p-type well 82), the insulating film including a thermally oxidized silicon oxide film (bottom oxide film) 74a having a thickness of 25 nm, a silicon nitride film 74b having a thickness of 50 nm and formed through CVD and a silicon oxide film (top oxide film) 74c having a thickness of 5 nm and formed by thermally oxidizing the surface of the silicon nitride film, respectively formed in this order from the bottom. Since the silicon nitride film 74b is thermally oxidized, it can be made dense.

As shown in FIG. 3B, the silicon oxide film (top oxide film) 74c is removed by using hydrofluoric acid chemical. The silicon oxide film may be removed by chemical dry etching (CDE) which damages less the underlying silicon nitride film 74b.

In the process described with reference to FIG. 3A, only the silicon oxide film (bottom oxide film) 74a and the silicon nitride film 74b may be formed and the process shown in FIG. 3B may be omitted.

As shown in FIG. 3C, a resist pattern 90 having a predetermined shape and formed by photolithography is deposited on the silicon nitride film 74b. By using the resist pattern 90 as a mask, the silicon nitride film 74b is etched by isotropical etching, e.g., wet etching using hot phosphoric acid.

As shown in FIG. 3D, since the isotropical etching is performed, the silicon nitride film 74b is etched not only in a thickness direction but also in an in-plane direction. Chemical also soaks into the interface between the silicon nitride film 74b and the resist pattern 90 so that the silicon nitride film 74b after etching has a tapered side wall, and converges from its bottom to the top. In FIG. 3D, the etched portion of the silicon nitride film 74b is surrounded by a broken line.

The silicon nitride film 74b is therefore etched covering the vertical transfer channel 73 and extending to the surface of the read gate 72. The resist pattern 90 is thereafter removed.

As shown in FIG. 3E, isotropical chemical dry etching may be used as the isotropical etching. As compared to wet etching, dry etching is hard to progress at the interface between the silicon nitride film 74b and the resist pattern 90. Therefore, the side wall of the etched silicon nitride film 74b has a tapered shape having the upper surface more steeper than the lower surface.

As shown in FIG. 3F, after the isotropical etching is performed and the resist pattern 90 is removed, the silicon nitride film 74b has the shape that it covers the vertical transfer channel 73 and extends to the surface of the read gate 72 and has a tapered side wall.

As shown in FIG. 3G, a silicon oxide film having a thickness of 5 nm is deposited by CVD on the exposed silicon oxide film 74a and on the etched silicon nitride film 74b to form an insulating film containing silicon oxide and silicon nitride. In FIG. 3G, the insulating film on the silicon nitride film 74b is represented by 74c, and the insulating film on the silicon oxide film (bottom oxide film) 74a is represented by 74a. The silicon oxide film 74c does not have the overhang shown in FIGS. 1C to 1E or FIGS. 2B to 2C.

As shown in FIG. 3H, a polysilicon film heavily doped with phosphorus is deposited to a thickness of 0.3 μm on the silicon oxide films 74a and 74c. By using a resist pattern formed by photolithography as a mask, the polysilicon film is etched by anisotropical reactive ion etching to form a first layer vertical transfer electrode 75b above the vertical transfer channel 73. Since the silicon oxide film 74 has no overhang, polysilicon will not be left in an unnecessary region.

As shown in FIG. 3I, the surface of the first layer vertical transfer electrode 75b is thermally oxidized to form an interlayer insulating film 80 in order to ensure electric isolation from a second layer vertical transfer electrode.

As shown in FIG. 3J, another polysilicon film is deposited and patterned to form the second layer vertical transfer electrode 75c serving also as the read gate electrode, above the vertical transfer channel. The surface of the second layer vertical transfer electrode 75c is thermally oxidized.

Thereafter, by using the first layer vertical transfer electrode and second layer vertical transfer electrode as a mask, n-type impurities, e.g., phosphorus or arsenic ions, are implanted to form a photoelectric conversion element 71 contiguous with the read gate 72 on the opposite side of the vertical transfer channel 73. A burying region 71a is formed on the photoelectric conversion element 71 by implanting p-type impurities, e.g., boron ions.

Figure 4A:
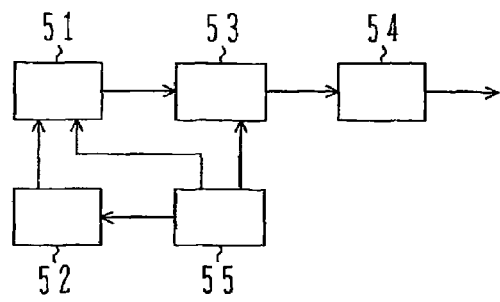
FIG. 4A is a block diagram showing a main portion of a solid state image pickup apparatus assembling a solid state image pickup device.
Figure 4C:
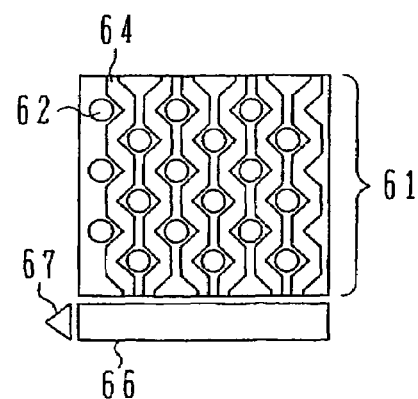
FIGS. 4B and 4C are schematic plan views showing the structure of the solid state image pickup device.
Figure 4B:
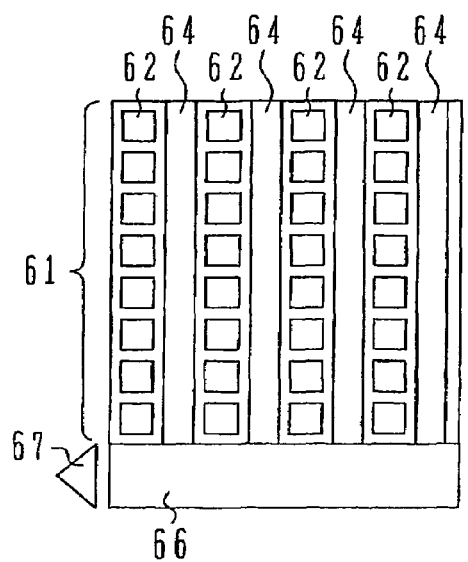
Figure 4D:
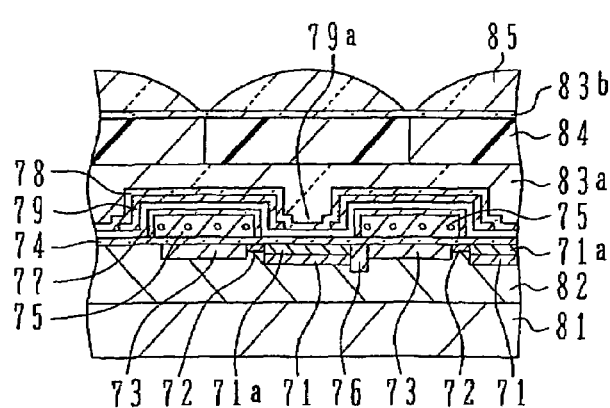
FIG. 4D is a schematic cross sectional view showing a portion of a pixel area of a solid state image pickup device.
Figure 5B:
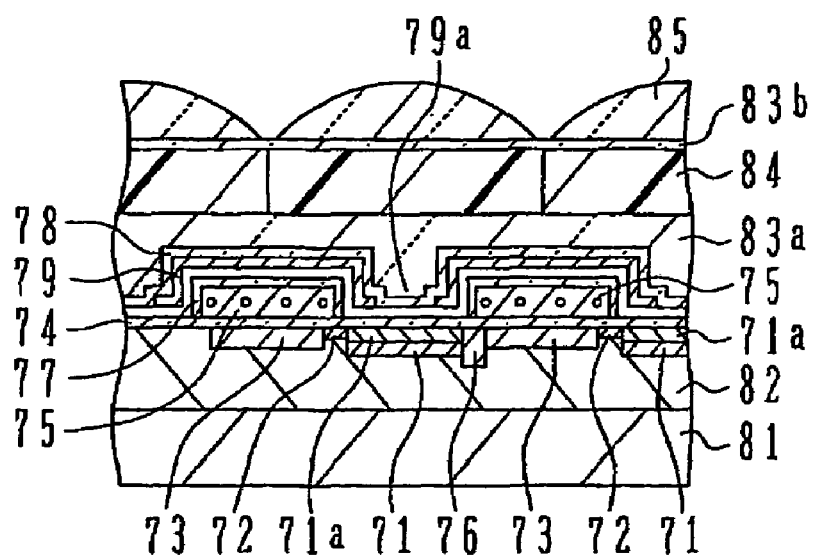
Figure 6A:
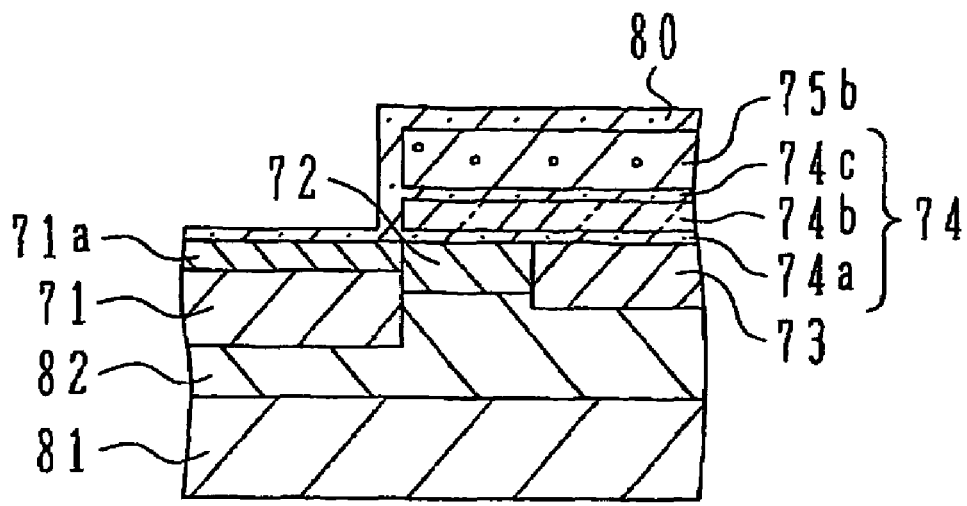
FIGS. 6A and 6B are schematic cross sectional views showing a gate insulating film near a read gate.
Figure 6B:
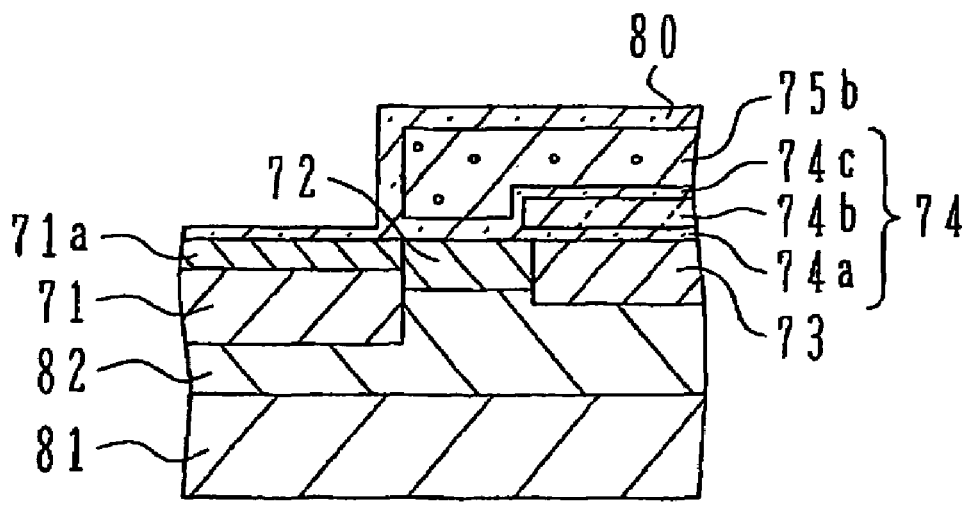
Figure 7A:
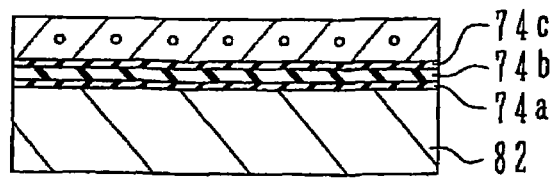
FIGS. 7A to 7E are schematic cross sectional views illustrating a manufacture method for the characteristic portion of a solid state image pickup device described in Japanese Patent Laid-open Publication No. 2003-332556.
Figure 7B:
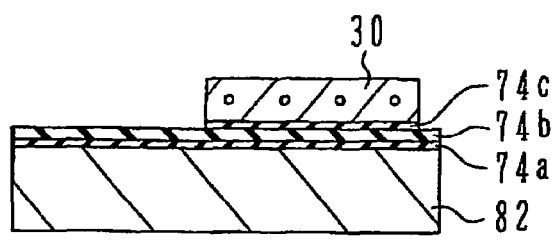
Figure 7C:
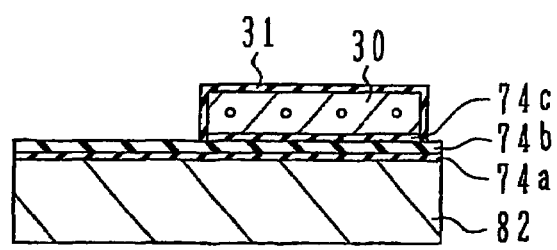
Figure 7D:
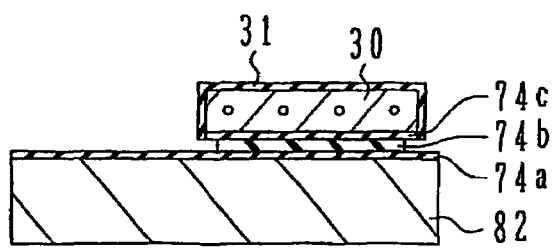
Figure 7E:
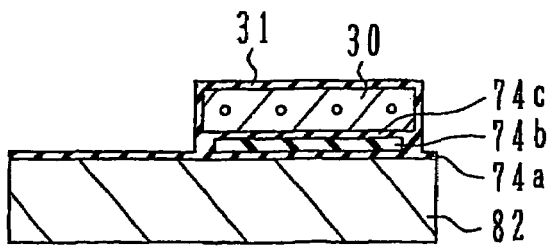

As shown in FIG. 5B, the processes of forming a light shielding film 79, a color filter layer 84, micro lenses 85 and the like are performed to form a solid state image pickup device such as shown in FIG. 4B. The solid state image pickup device shown in FIG. 4B includes photosensors 62, a plurality of vertical CCDs 64 disposed adjacent to each column of the photosensors 62, a horizontal CCD 66 electrically coupled to one ends of the plurality of vertical CCDs 64 and an amplification circuit 67 connected to an output terminal of the horizontal CCD 66.

By using the solid state image pickup device, the solid state image pickup apparatus such as shown in FIG. 4A can be formed. The solid state image pickup apparatus shown in FIG. 4A is constituted of a solid state image pickup device 51, a drive signal generator 52 for supplying drive signals to the solid state image pickup device 51, an analog front end (AFE) 53 for performing AND conversion and the like of an image signal input from the solid state image pickup device 51, a digital signal processor (DSP) 54 for performing recognition, data compression and the like of the image signal input from AFE 53 and a timing generator (TG) 55 for supplying timing signals to the solid state image pickup device 51, drive signal generator 52 and AFE 53.

The solid state image pickup device manufactured by the above-described processes has the insulating film constituted of a silicon oxide film and a silicon nitride film formed on and above the photoelectric conversion element, read gate and vertical transfer channel. The silicon nitride film in this insulating film has a tapered side wall, covers the vertical transfer channel and extends to the surface of the read gate. The silicon oxide film on the silicon nitride film has no overhang. Since the side wall of the silicon nitride film has a tapered side wall and the silicon oxide film has no overhang, it is possible to prevent polysilicon from being left in an unnecessary region. Accordingly, an insufficient breakdown voltage between the first layer vertical transfer channel and second layer vertical transfer channel can be avoided. Since the silicon nitride film is not formed above the portion of the read gate on the photoelectric conversion element side, the temporal change in the charge read voltage and the degradation of a transfer efficiency can be suppressed. It is therefore possible to manufacture a high quality solid state image pickup device.

In the embodiment, the solid state image pickup device having the first layer vertical transfer electrode and second layer vertical transfer electrode has been described. The embodiment is applicable to a solid state image pickup device having three layers or a single layer of vertical transfer electrodes.

The present invention has been described in connection with the preferred embodiments. The invention is not limited only to the above embodiments. It will be apparent to those skilled in the art that other various modifications, improvements, combinations, and the like can be made.

The above-described solid state image pickup device can be used with general digital cameras and apparatuses equipped with a digital camera function such as a portable phone.

The invention claimed is:

1. A solid state image pickup device comprising:
a plurality of photoelectric conversion elements, disposed in a semiconductor substrate in a matrix shape, for photoelectrically converting incidence light into signal charge;
a plurality of vertical transfer channels each disposed in said semiconductor substrate adjacent to each column of said photoelectric conversion elements;

a read gate, formed between a photoelectric conversion element in said plurality of photoelectric conversion elements and a vertical transfer channel in said plurality of vertical transfer channels, for controlling read signal charge generated in said photoelectric conversion element to said vertical transfer channel;

an insulating film including a silicon oxide film formed on said semiconductor substrate and covering said photoelectric conversion elements, said read gate and said vertical transfer channel, and a silicon nitride film covering said vertical transfer channel via said silicon oxide film, extending above a surface of said read gate, and having a tapered side wall;

a plurality of vertical transfer electrodes having a plurality of layers alternately formed along a column direction and formed above said insulating film, said plurality of vertical transfer electrodes reading signal charge generated in each of said photoelectric conversion elements to a corresponding one of said vertical transfer channels by controlling a potential of said read gate, and transferring the signal charge read to said vertical transfer channel along the column direction by controlling a potential of said vertical transfer channel; and a horizontal CCD for transferring signal charge transferred from said vertical transfer channels along a row direction, wherein said side wall of said silicon nitride film comprises a lower portion and an upper portion having a slope which is greater than a slope of said lower portion.

2. The solid state image pickup device according to claim 1, wherein said photoelectric conversion elements arc disposed in a tetragonal matrix shape.

3. The solid state image pickup device according to claim 1, wherein said insulating film includes a silicon oxide film formed on said silicon nitride film.

4. The solid state image pickup device according to claim 1, wherein said vertical transfer electrodes comprise double polysilicon layers.

5. The solid state image pickup device according to claim 1, wherein said side wall of said silicon nitride film is formed over said read gate.

6. The solid state image pickup device according to claim 1, wherein said side wall of said silicon nitride film slopes downward in a direction away from said vertical transfer channel and toward said read gate.

7. The solid state image pickup device according to claim 1, wherein said insulating film comprises another silicon oxide film formed on said sidewall of said silicon nitride film.

8. The solid state image pickup device according to claim 1, wherein said plurality of vertical transfer electrodes comprises a first vertical transfer electrode formed on said insulating film and a second vertical transfer electrode formed on said first vertical transfer electrode.

9. A manufacture method for a solid state image pickup device, comprising:

forming a vertical transfer channel and a read gate contiguous with each other by doping impurities into a semiconductor substrate;

forming a first silicon oxide film on a surface of said semiconductor substrate in an area of said vertical transfer channel and said read gate, and forming a silicon nitride film on said first silicon oxide film;

forming a resist pattern on said silicon nitride film, isotropically etching said silicon nitride film by using said resist pattern as a mask, and thereafter removing said resist pattern;

forming a second silicon oxide film on a surface of said etched silicon nitride film to form an insulating film containing silicon oxide films and a silicon nitride film;

forming a vertical transfer electrode above said vertical transfer channel; and doping impurities into said semiconductor substrate to form a photoelectric conversion element contiguous with said read gate on an opposite side of said vertical transfer channel, wherein said forming said resist pattern comprises performing isotropical etching to make said silicon nitride film have a tapered side wall and cover said vertical transfer channel and extend over said read gate.

10. The manufacture method for a solid state image pickup device according to claim 9, wherein said forming said first silicon oxide film includes a forming a third silicon oxide film by thermally oxidizing the surface of said silicon nitride film and thereafter removing said third silicon oxide film.

11. The manufacture method for a solid state image pickup device according to claim 10, wherein the isotropical etching in said firming said resist pattern comprises one of isotropical wet etching and isotropical chemical dry etching.

12. The manufacture method for a solid state image pickup device according to claim 9, wherein the isotropical etching in said forming said resist pattern comprises one of isotropical wet etching and isotropical chemical dry etching.

13. A solid state image pickup comprising:

a plurality of photoelectric conversion elements, disposed in a semiconductor substrate in a matrix shape, for photoelectrically converting incidence light into signal charge;

a plurality of vertical transfer channels each disposed in said semiconductor substrate adjacent to each column of said photoelectric conversion elements;

a read gate, formed between a photoelectric conversion clement in said plurality of photoelectric conversion elements and a vertical transfer channel in said plurality of vertical transfer channels, for controlling read signal charge generated in said photoelectric conversion element to said vertical transfer channel;

an insulating film including a silicon oxide film formed on said semiconductor substrate and covering said photoelectric conversion elements, said read sate and said vertical transfer channel, and a silicon nitride film covering said vertical transfer channel via said silicon oxide film, extending above a surface of said read gate, and having a tapered side wall;

a plurality of vertical transfer electrodes having a plurality of layers alternately formed along a column direction and formed above said insulating film, said plurality of vertical transfer electrodes reading signal charge generated in each of said photoelectric conversion elements to a corresponding one of said vertical transfer channels by controlling a potential of said read gate, and transferring the signal charge read to said vertical transfer channel along the column direction by controlling a potential of said vertical transfer channel; and a horizontal CCD for transferring signal charge transferred from said vertical transfer channels along a row direction, wherein said plurality of vertical transfer electrodes comprises a first vertical transfer electrode formed on said insulating film and a second vertical transfer electrode formed on said first vertical transfer electrode, and wherein first vertical transfer electrode comprises a bottom portion including a tapered side wall which is formed on said tapered side wall of said silicon nitride film.

* * * * *